(12) United States Patent
Namerikawa et al.

(10) Patent No.: US 7,019,442 B2
(45) Date of Patent: Mar. 28, 2006

(54) PIEZOELECTRIC/ELECTROSTRICTIVE DEVICE

(75) Inventors: Masahiko Namerikawa, Seto (JP);
Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/729,423

(22) Filed: Dec. 5, 2003

(65) Prior Publication Data
US 2004/0169440 A1    Sep. 2, 2004

(30) Foreign Application Priority Data
Dec. 9, 2002    (JP)    ............................. 2002-356662

(51) Int. Cl.
*H01L 41/08* (2006.01)
(52) U.S. Cl. ...................... 310/331; 310/332
(58) Field of Classification Search ................ 310/328, 310/330–332
See application file for complete search history.

(56) References Cited

U.S. PATENT DOCUMENTS

| | | | | |
|---|---|---|---|---|
| 4,612,440 A | * | 9/1986 | Brunnee et al. | ............ 250/281 |
| 6,455,981 B1 | * | 9/2002 | Takeuchi et al. | ............ 310/324 |
| 6,531,805 B1 | * | 3/2003 | Ikeda et al. | ................. 310/331 |

FOREIGN PATENT DOCUMENTS

JP    2002-026412    1/2002

* cited by examiner

*Primary Examiner*—Mark Budd
(74) *Attorney, Agent, or Firm*—Burr & Brown

(57) ABSTRACT

There is disclosed a piezoelectric/electrostrictive device which has large vibration isolation properties and which copes with high-rate access and densification of data and which is capable of inhibiting off-track from being caused and which comprises: a substrate including a support portion constituted of a thick member and two arm portions constituted of thin-plate members extended from the support portion; and a driving member disposed on at least one arm portion and in which a plurality of grooves is formed in at least a surface positioned on an extending-direction side of the at least one arm portion in the support portion.

22 Claims, 5 Drawing Sheets

US 7,019,442 B2

PIEZOELECTRIC/ELECTROSTRICTIVE DEVICE

This application claims the benefit of Japanese Application 2002-356662, filed Dec. 9, 2002, the entirety of which is incorporated herein by reference.

BACKGROUND OF THE INVENTION AND THE RELATED ART

The present invention relates to a piezoelectric/electrostrictive device, more particularly to a piezoelectric/electrostrictive device which is suitable for an actuator for a magnetic head and which is superior in vibration isolation properties.

Important basic characteristics of a hard disk drive or the like lie in that a magnetic head can be positioned in a targeted specific data track.

On the other hand, in the hard disk drive or the like, in recent years, it has been strongly demanded that the magnetic head is more precisely positioned in the specific data track with densification of data and progress of high-rate access.

Under this situation, examples of a piezoelectric/electrostrictive device for use as an actuator for the magnetic head of the hard disk drive include a device including: a substrate including two arm portions formed of thin-plate members and extended from opposite ends of a support portion formed of a thick member; and a driving member including at least one pair of electrodes and one piezoelectric/electrostrictive layer which are fixed to at least one arm portion of the substrate as described in JP-A-2002-26412.

However, even with the above-described piezoelectric/electrostrictive device, occurrence of off-track has resulted in a serious problem with further densification of data and high-rate access.

In recent years, in the hard disk drive or the like, it has been essential to rotate a hard disk at a high speed in order to satisfy the demand for the high-rate access. However, as shown in FIG. 7, since the high-speed rotation of a disk 21 generates an airflow 22 at a wind velocity of about 10 to 50 m/s in the drive, a magnetic head 24 attached to a tip of a suspension vibrates by the airflow 22, and a problem of the off-track occurs. Moreover, it is expected that this problem becomes more remarkable with further densification of data and high-rate access, and there has been a strong demand for solution of the problem.

SUMMARY OF THE INVENTION

The present invention has been developed to solve the above-described problem, and an object thereof is to provide a piezoelectric/electrostrictive device suitable for an actuator for a magnetic head, for example, which has a function of preventing the actuator for the magnetic head from vibrating by an airflow generated in a hard disk drive and which meets a demand for high-rate access and for densification of data and which is capable of inhibiting generation of off-track.

As a result of intensive studies for solving the above-described problem, the present inventors have found that vibration by the airflow decreases by a predetermined groove formed in a specific portion of a substrate constituting the piezoelectric/electrostrictive device, and have completed the present invention.

That is, according to the present invention, there is provided a piezoelectric/electrostrictive device comprising: a substrate including a support portion constituted of a thick member and two arm portions constituted of thin-plate members extended from the support portion; and a driving member including at least one pair of electrodes and one piezoelectric/electrostrictive layer which are disposed on at least one arm portion, wherein a plurality of grooves is formed in at least a surface positioned on an extending-direction side of said at least one arm portion in the support portion.

Figure 1:
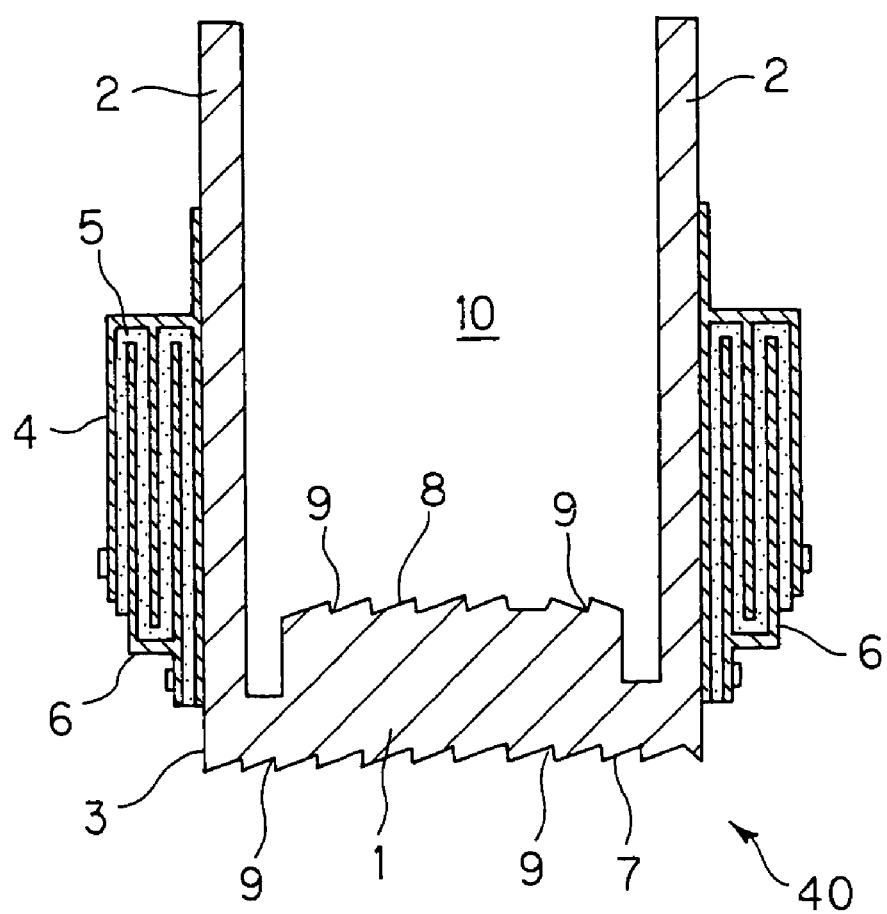
FIG. 1 is a sectional view showing one embodiment of the present invention.

Additionally, reference numerals used in the above-described drawings have the following meanings:

1 . . . support portion; 2 . . . arm portion; 3 . . . substrate; 4 . . . electrode; 5 . . . piezoelectric/electrostrictive layer; 6 . . . driving member; 7 . . . surface on a side opposite to a surface positioned on an extending-direction side of the arm portion in the support portion; 8 . . . surface positioned on the extending-direction side of the arm portion in the support portion; 9 . . . groove; 10 . . . space in which the support portion and two arm portions are directed inwards; 21 . . . disk; 22 . . . airflow; 23 . . . suspension; 24 . . . magnetic head; and 40 . . . piezoelectric/electrostrictive device.

DESCRIPTION OF PREFERRED EMBODIMENTS

An embodiment of the present invention will concretely be described. Additionally, the present invention is not limited or interpreted by the following description and, needless to say, the present invention can variously be altered, modified, and improved based on knowledge of a person skilled in the art without departing from the scope.

A reason why a piezoelectric/electrostrictive device of the present invention is superior in vibration isolation properties against an airflow is not necessarily clear, but is presumed as follows according to the present inventor's study. First, airflows exist in various directions in devices such as a hard disk drive, but a cause for vibration of the piezoelectric/electrostrictive device is considered to be an airflow which enters a space where a support portion and two arm portions are directed inwards to collide with the support portion or which passes in the vicinity of a substrate. This is supposedly because a large air pressure is easily applied at the time of the collision of the airflow with the support portion and because the airflow passing in the vicinity of the support portion peels from the substrate in an early stage to cause a large turbulence, when caught in a low-pressure region backward in the substrate.

On the other hand, in the present invention, since a groove is formed in the surface of the support portion on the side of the space, the air pressure applied to the support portion can be distributed at the time of the collision of the airflow with the support portion including the groove. Moreover, a small turbulence can be generated to such an extent that vibration is not caused in the piezoelectric/electrostrictive device. Furthermore, for this small turbulence, it is considered that generation of a large turbulence can be reduced, when the airflow passing in the vicinity of the substrate is inhibited from peeling from the substrate to move a peel point backwards and the airflow is inhibited from being caught backward in the substrate. It is to be noted that a direction of the airflow can be guided to a certain degree in accordance with the direction of the groove to reduce the vibration.

Figure 2:
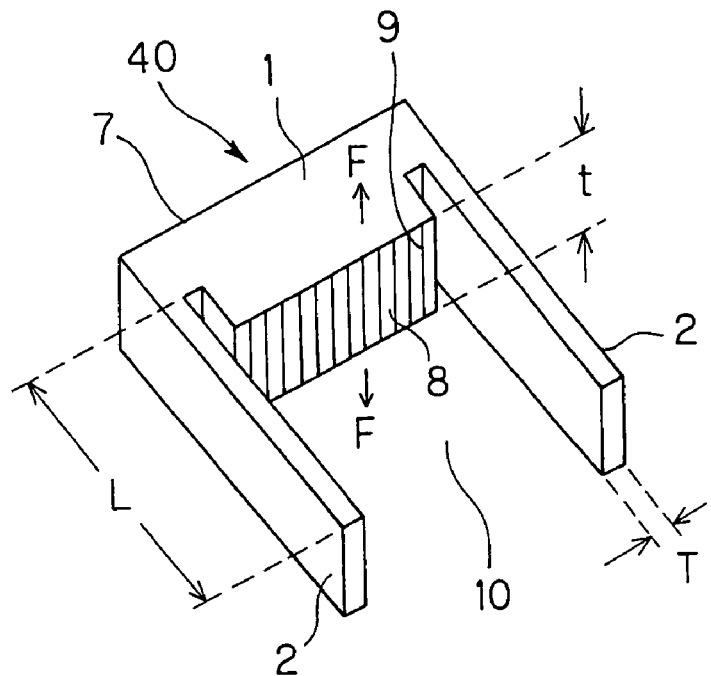
FIG. 2 is a perspective view schematically showing one example of a substrate portion in the present invention.
Figure 3:
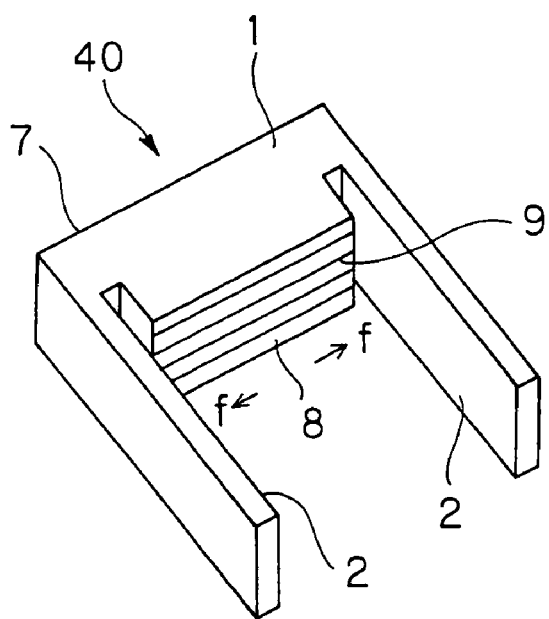
FIG. 3 is a perspective view schematically showing another example of the substrate portion in the present invention.
Figure 4:
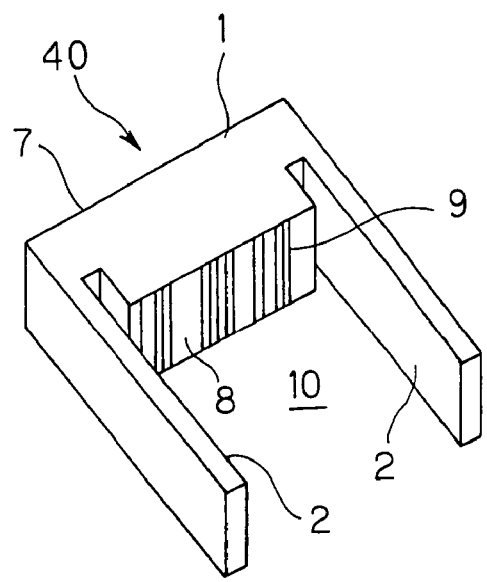
FIG. 4 is a perspective view schematically showing still another example of the substrate portion in the present invention.

FIG. 1 is a sectional view schematically showing one embodiment of the present invention, and FIGS. 2 to 4 are perspective views schematically showing one example of a substrate portion of the piezoelectric/electrostrictive device of the present invention. As shown in FIG. 1, a piezoelectric/electrostrictive device 40 of the present invention includes: a substrate 3 including two arm portions 2 constituted of thin-plate members and extended from a support portion 1 constituted of a thick member; and a driving member 6 including at least one pair of electrodes 4 and one piezoelectric/electrostrictive layer 5 which are fixed/formed on at least one arm portion 2 of the substrate 3, for example, by bonding. A plurality of grooves 9 is formed in at least a surface 8 positioned on an extending-direction side of the arm portion 2 in the support portion 1.

Accordingly, the vibration of the piezoelectric/electrostrictive device 40 can be reduced even in an environment where an airflow exists, and high vibration isolation properties can be imparted to the piezoelectric/electrostrictive device 40.

As shown in FIGS. 1, 2 and the like, for the substrate 3 in the present invention, two arm portions 2 and the support portion 1 may be bonded in such a manner that functions of the arm portions 2 as diaphragms can be secured, but two arm portions 2 are usually extended from the opposite ends of the support portion 1, and a sectional shape in the extending direction of the arm portions 2 substantially forms a U shape.

Additionally, the shape of the support portion 1 is not especially limited as long as the portion is thick, and various shapes such as a rectangular parallelepiped, a triangular prism, and a pillar whose section is circular, elliptic, or oval may be used. The arm portion 2 is not especially limited as long as the portion has a thin-plate shape, and the surface on which the driving member is disposed may have various shapes such as a rectangle, a trapezoid, and an ellipse.

Moreover, in the substrate 3 in the present invention, a thickness (thickness in a direction F perpendicular to the extending direction of the arm portion) t of the support portion 1 shown in FIG. 2 is preferably 1.0 mm or less, more preferably 0.5 mm or less. A length L of a portion of the arm portion 2 projecting from the support portion 1 is preferably 5 mm or less, more preferably 2.5 mm or less.

When the thickness t of the support portion 1 and the length L of the portion of the arm portion 2 projecting from the support portion 1 are in these ranges, air resistance of the piezoelectric/electrostrictive device 40 against the airflow is reduced, and the vibration isolation properties can effectively be fulfilled by the presence of the grooves 9 described later.

Figure 5:
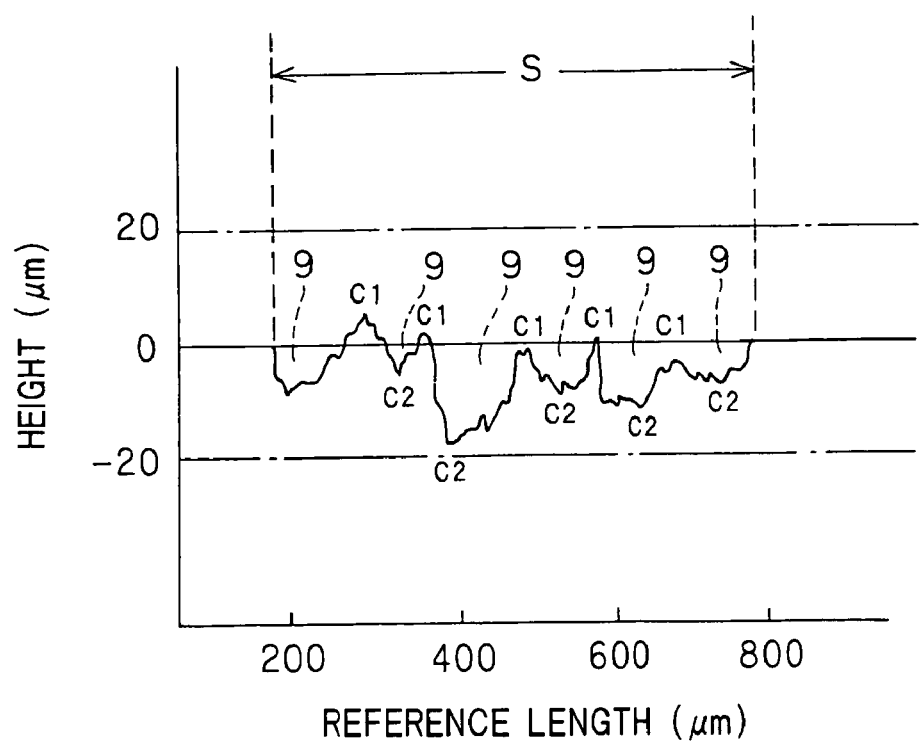
FIG. 5 is a graph showing one example of a fluctuation of a height of a groove formed in a support portion in the present invention.

In the present invention, for example, when a laser microscope (OLS1100 manufactured by Olympus Optical Co., Ltd.) is used to take in height data in an arbitrary range (e.g., support portion length direction x: 1 mm×thickness direction y: 0.3 mm) and an image is processed, each groove formed in the substrate is drawn by 5 µm or more in a predetermined direction of a support portion surface. As shown in FIG. 5, the height of the support portion surface may fluctuate by 0.5 µm or more per reference length s (parallel movement distance in which the presence of the groove is ignored) of 10 µm (the grooves are denoted with reference numeral 9 in the drawing).

In the present invention, a plurality of grooves is further preferably formed at predetermined intervals in a surface disposed opposite to the upper surface of the support portion.

Moreover, the grooves formed in the surface 8 positioned on the extending-direction side of the arm portion in the support portion preferably extend in such a direction that the airflow which has collided with the surface 8 can blow through. This groove more preferably extends to an edge of the direction through which the airflow can blow in the support portion. On the other hand, the grooves formed in the surface 8 positioned on the extending-direction side of the arm portion in the support portion also preferably extend in the direction perpendicular to the direction through which the airflow that has collided with the surface 8 can blow.

Moreover, in the present invention, the grooves formed in the support portion are preferably arranged at intervals of 10 to 500 µm on the average, and the groove formed in the support portion preferably has a depth of 5 to 100 µm. The depth of each groove formed in the support portion preferably fluctuates at a standard deviation of 3 µm or more.

In the present invention, the length of the portion of the arm portion projecting from the support portion is preferably 2.5 mm or less, and the thickness of the support portion in the direction perpendicular to the extending direction of the arm portion is 0.5 mm or less.

Moreover, a thickness T of the arm portion in the present invention is preferably 10 to 100 µm, more preferably 20 to 70 µm so that flexural displacement of the driving member (not shown) is prevented from decreasing by an increase of rigidity while securing mechanical strength of the piezoelectric/electrostrictive device 40.

In the present invention, materials of the support portion 1 and the arm portions 2 are not especially limited, and an appropriate material may be selected in accordance with applications. The examples include: at least one metal material selected from a group consisting of iron-based alloys such as various stainless steels and a spring steel, copper-based alloys such as brass and beryllium copper, and aluminum-based alloys such as duralumin; a ceramic material containing at least one selected from a group consisting of stabilized zirconium oxide, aluminum oxide, magnesium oxide, titanium oxide, spinel, mullite, aluminum nitride, silicon nitride, and glass; and a cermet material. Above all, various stainless steels are preferable because they are large in mechanical strength, superior in toughness, high in chemical stability, and low in cost.

For the piezoelectric/electrostrictive device of the present invention, as shown in FIG. 2, a plurality of grooves is formed in at least the surface (also referred to as the inner surface of the support portion or the upper surface of the support portion) 8 positioned on the extending-direction side of the arm portion 2 in the support portion 1. Additionally, as shown in FIG. 1, further in the present invention, a plurality of grooves (not shown) is also preferably formed at predetermined intervals in a surface 7 of the support portion 1 positioned opposite to the surface 8 of the support portion 1 positioned on the extending-direction side of the arm portion 2. When the plurality of grooves are also formed in the surface 7 of the support portion 1 positioned opposite to the surface 8 of the support portion 1 in this manner, for example, the airflow generated by rotation or the like of the disk in devices such as a hard disk collides with various components in the device and does not necessarily flow only in a certain direction, and therefore the vibration isolation properties can be enhanced.

Moreover, as shown in FIG. 3, the plurality of grooves 9 formed in the surface 8 of the support portion 1 positioned on the extending-direction side of the arm portion 2, and also in the surface 7 of the support portion 1 positioned on the opposite side if desired are preferably drawn and formed in a direction f perpendicular to the direction through which the airflow that has collided with the support portion surface can blow. In the piezoelectric/electrostrictive device in which the plurality of grooves is formed, the vibration of the device by the airflow is further reduced possibly because an effect of inhibiting the airflow from peeling from the substrate is large.

Moreover, as shown in FIG. 2, the grooves are also preferably drawn in a direction F through which the airflow is forced to blow by the presence of the arm portions 2 at the time of the collision of the airflow with the surface 8 of the support portion 1 positioned on the extending-direction side of the arm portion 2. In this piezoelectric/electrostrictive device, the effect of inhibiting the airflow from peeling is expected to be reduced to some degree, but the airflow which has collided with the inner surface 8 of the support portion 1 is guided by the grooves 9 and easily blows through without colliding with the arm portions 2. Therefore, the vibration isolation properties substantially similar to those of the device including the grooves drawn in the above-described direction f can be imparted. As shown in FIG. 2, the grooves 9 extending in this direction are preferably drawn to the edge of the direction F in the support portion 1 where the air flow can blow (position corresponding to the thickness t of the direction F from which the air flow can blow in the support portion 1) in order to more securely impart an effect of guiding the airflow.

Moreover, when the plurality of grooves 9 is formed as shown in FIGS. 1 to 3, the plurality of grooves 9 formed in the substrate 3 is preferably arranged at intervals of 10 to 500 μm on the average in order to effectively fulfill a vibration isolation effect. Furthermore, the plurality of grooves 9 is not always to be necessarily arranged at an equal interval in the substrate 3 as shown in FIG. 2, and the plurality of grooves 9 may preferably be arranged irregularly in the substrate 3 as shown in FIG. 4. In this case, since micro turbulence of the airflow occurs at random, a large turbulence is preferably difficult to be generated backwards.

In order to make the plurality of grooves 9 formed in the substrate 3 shown in FIG. 1 or the like in the present invention effectively exhibit the vibration isolation effect, the one having a depth of 5 to 100 μm is preferable; and the one having a depth of 5 to 20 μm is more preferable.

However, one does not make necessarily the depth of each groove 9 uniform, and the depth of grooves formed in the substrate 3 showing fluctuation with a standard deviation of 3 μm or more is preferable because the large turbulence is easily inhibited. It is to be noted that the depth of the groove mentioned herein means a difference in height between a maximum point $c1$ and the next minimum point $c2$ of each waveform indicating the fluctuation of the height of the support portion surface in a graph shown in FIG. 5 in which the depth of the groove is measured with a laser microscope. Additionally, the fluctuation of 3 μm or less in height of the waveform to the minimum point $c2$ from the maximum point $c1$ was excluded from an object of measurement.

In the present invention, the shape of the groove is not especially limited, and the examples of the sectional shape in a depth direction perpendicular to the drawing direction of the groove include a V shape, a semicircular shape, and a U shape. Above all, the sectional shape in the depth direction perpendicular to the drawing direction of the groove is more preferably the semicircular shape or the U shape because the local occurrence of the large turbulence can be inhibited.

The examples of a method of forming the groove in the support portion in the present invention include a method in which a thick support portion is prepared in a desired shape with the above-described metal material. Subsequently, the desired surface of the support portion is coated with a photo resist, treatments such as photo-sensitizing and developing are carried out to form a resist pattern in which the support portion surface is linearly exposed at a predetermined interval, an etchant is sprayed onto the support portion surface which is not masked, and etching is performed. In this method, the pattern for forming the grooves can easily be controlled, and the depth of the groove can also easily be controlled in accordance with an etching time. The semicircular or U-shaped sectional shape of the groove in the depth direction perpendicular to the drawing direction of the groove is obtained.

Moreover, as the method of disposing the groove in the support portion in the present invention, a method of stacking thin plates formed in the desired shapes by the etching to manufacture the substrate may also be used.

That is, after a plurality of thin plates are first prepared with the above-described metal material, opposite major surfaces of each obtained metallic thin plate are coated with the photo resist. Subsequently, the photo mask having the desired pattern corresponding to the final shape of the substrate (the pattern is reversed, when the photo resist is positive or negative) is used to photo-sensitize the respective surfaces, and an image is developed on dry or wet conditions to remove the photo resist from a portion to be etched. Subsequently, etchants such as a ferric chloride solution are sprayed onto the opposite surfaces to form a metallic thin plate having a predetermined shape by a corrosion reaction.

In this case, the corrosion does not easily proceed by the presence of the photo resist right under the photo resist, and the corrosion easily proceeds in a portion farther from the photo resist. Therefore, when the type of the etchant, the etching time, and the like are selected, the corrosion conditions are set so as to be excessive. When an etching treatment is carried out from the opposite surfaces of the metallic thin plate, the groove having the semicircular or U-shaped sectional shape (thickness direction) including a lowermost point in the vicinity of a middle of the thickness direction can be formed in the end surface of the thin plate formed by the etching treatment. Then, the substrate including the plurality of grooves at the predetermined intervals can be integrally formed by stacking a plurality of metal thin plates subjected to the etching treatment with aligning the uppermost points of their end surfaces wherein the plurality of grooves are formed, and bonding finally with a aid of an adhesive, or diffusion bonding.

In this method, a width, interval, depth, and the like of the groove can be adjusted by the thickness and etching conditions (temperature, time, concentration of the etchant, and the like) of each thin plate to be stacked. The semicircular or U-shaped sectional shape in the depth direction is obtained.

Further in the present invention, punching processing can be used to form the groove. For example, a clearance between a punch and a die is optimized in such a manner that the end of each thin plate has an appropriate tapered shape to punch the plurality ceramic green sheet or the plurality of metallic thin plates in a desired outer shape corresponding to the final shape of the substrate, and the respective finally obtained thin plates are integrated while the ends formed by the punching processing are substantially aligned. This method may also be used. In this method, a substantially V-shaped sectional shape in the depth direction perpendicular to the drawing direction of the groove is obtained, and the shape of the groove may also be uniformed. It is to be noted that, for example, a slurry containing a ceramic raw material and added materials in a dispersion medium can be used to mold and obtain the thin plate formed of ceramic in a sheet shape by a doctor blade process or the like. To integrate the ceramic green sheet, a plurality of ceramic green sheets may be thermally bonded, stacked, fired, and integrated. The metallic thin plates may be integrated by the bonding with an adhesive or a diffusion bonding.

As shown in FIG. 1, the driving member 6 in the present invention is constituted of at least one pair of electrodes 4 and one piezoelectric/electrostrictive layer 5, and the driving member is fixed to at least one arm portion of the substrate in order to transmit vibration by the driving to a predetermined member or device.

Figure 6:
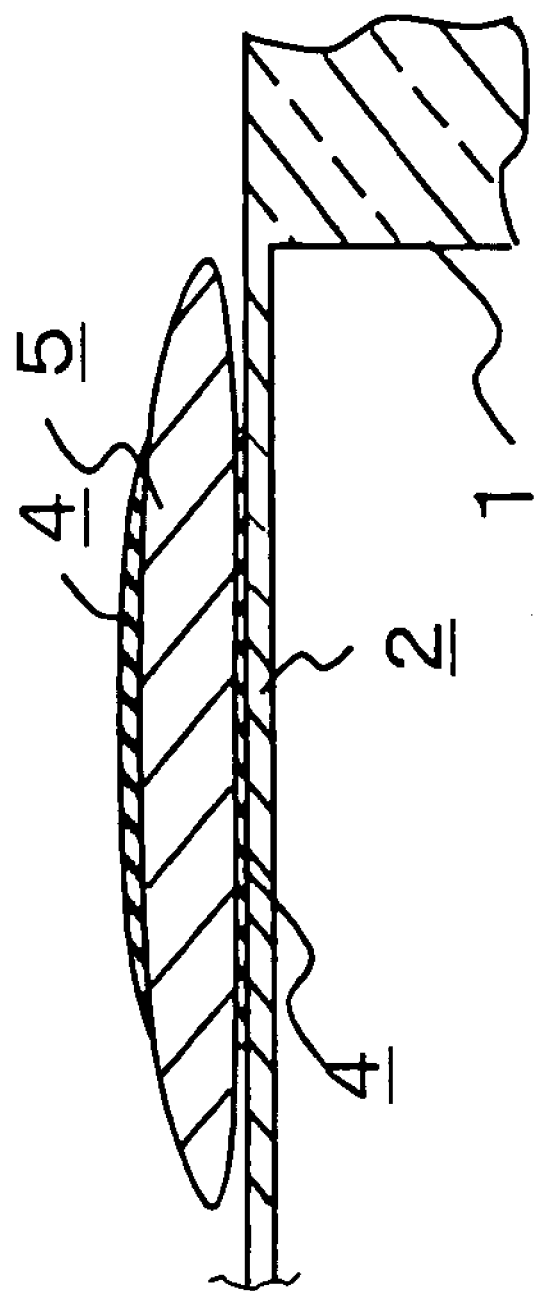
FIG. 6 is a partially sectional view schematically showing one example of a driving member in the present invention.
Figure 7:
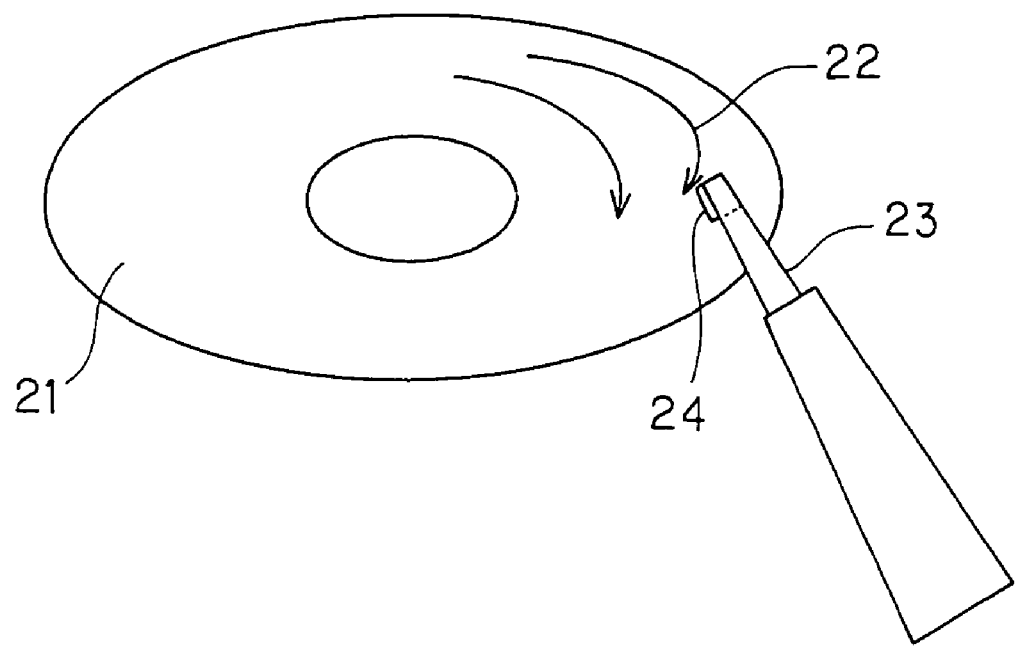
FIG. 7 is an explanatory view schematically showing a state in a hard disk drive.

In the present invention, the materials of the electrodes 4 and the piezoelectric/electrostrictive layer 5 are not especially limited, and various materials applied to a piezoelectric/electrostrictive film type device may be used. Moreover, a structure of the driving member 6 is not especially limited. For example, the structure may be constituted of one piezoelectric/electrostrictive layer 5 and one pair of electrodes 4 electrically connected to the layer as shown in FIG. 6, or a plurality of electrodes 4 alternately stacked on a plurality of piezoelectric/electrostrictive layers 5.

EXAMPLES

The present invention will hereinafter more concretely be described in accordance with examples of a piezoelectric film type device, but the present invention is not limited to these examples. It is to be noted that the piezoelectric/electrostrictive devices obtained in the examples and a comparative example were evaluated as follows.

Vibration Isolation Property Test

For the piezoelectric/electrostrictive devices obtained in the respective examples and the comparative example, two tip portions of the arm portion and two portions of the support portion were fixed and arranged by a piano wire having a linear diameter of 80 μm in a test region of a suction type small-sized wind tunnel test device in a state in which a tensile force was applied to the portions. A wind velocity was gradually raised to 70 m/s that was possible in the hard disk drive by suction in this state, and a degree of vibration of the piezoelectric/electrostrictive device was measured. In this case, the vibration was measured using a laser Doppler velocimeter. Additionally, only the piano wire was disposed with the same tensile force and it was confirmed beforehand that the vibration was not caused up to the wind velocity of 70 m/s.

Depth, Length, Shape of Groove

A laser microscope (OLS1100 manufactured by Olympus Optical Co., Ltd.) was used, a longitudinal direction of the support portion was assumed to be an x-axis, the thickness direction which was perpendicular to the extending direction of the arm portion was assumed to be a y-axis, height data in a range of x×y=1 mm×0.3 mm was taken, and the data was measured and observed by image processing.

Example 1

First, a metal material formed of SUS304 was machined and cut to prepare a prismatic support portion having a size of 1.0 mm×0.4 mm×0.25 mm and two thin plate arm portions having a size of 2.0 mm×0.25 mm×0.05 mm.

Subsequently, after coating one 1.0 mm×0.25 mm surface in the support portion (corresponding to the surface positioned on the extending-direction side of the completed arm portion) with the positive photo resist, the photo mask capable of exposing a linear pattern having an interval of 0.2 mm, width of 0.05 mm, and length of 0.25 mm to light is used to photo-sensitize and develop/treat the image, and the linear resist pattern was formed at the predetermined interval in the longitudinal direction of the support portion. Thereafter, the etchant formed of ferric chloride was sprayed on the surface on which the resist pattern was formed (finally forming the surface positioned on the extending-direction side of the arm portion) to carry out the corrosion reaction for ten seconds, and subsequently a masking material was dissolved by a solvent.

Subsequently, after coating the opposite end surfaces of the support portion in the longitudinal direction with the adhesive, the major surface of one end of two arm portions was pressed/attached onto the opposite end surfaces, and the substrate was prepared including a plurality of grooves whose sectional shapes in the extending direction of the arm portion were substantially U-shapes.

Finally, the driving members including one pair of electrodes disposed on the opposite surfaces of the piezoelectric/electrostrictive layer were bonded to two arm portions via the adhesive to obtain the piezoelectric/electrostrictive device in which the thickness of the support portion was 0.25 mm and the portion of the arm portion projecting from the support portion was 1.5 mm. Here, the thickness of the support portion means the thickness in the extending direction of the arm portion and the direction perpendicular to a line connecting two arm portions to each other.

In the obtained piezoelectric/electrostrictive device, a plurality of grooves drawn in a length of 0.25 mm was formed at an interval of 200 μm on the average in a depth of 10 to 20 μm in the surface of the support portion positioned on the extending-direction side of the arm portion in the thickness direction of the support portion. Through this direction, the airflow which had collided with the support portion surface was capable of blowing. The sectional shape of the groove in the depth direction was substantially the U-shape.

Example 2

The piezoelectric/electrostrictive device was manufactured in the same manner as in Example 1 except that a portion having a size of 1.0 mm×0.25 mm was etched/treated in two surfaces corresponding to the surface positioned on the extending-direction side of the arm portions after completion and the surface position on the opposite side in the support portion.

For the obtained piezoelectric/electrostrictive device, a plurality of grooves having a depth of 10 to 20 µm and a length of 0.25 mm and extending in the thickness direction of the support portion was formed at an interval of 200 µm on the average in the surface of the support portion positioned on the extending-direction side of the arm portions and the surface positioned on the opposite side. The sectional shape of the groove in the depth direction was substantially the U-shape.

Example 3

The piezoelectric/electrostrictive device was manufactured in the same manner as in Example 1 except that the photo-sensitizing was carried out using the photo mask capable of exposing the linear pattern having an interval of 0.2 mm, width of 0.05 mm, and length of 0.15 mm to light.

For the obtained piezoelectric/electrostrictive device, a plurality of grooves having a depth of 10 to 20 µm and a length of 0.15 mm and extending in the thickness direction of the support portion was formed at an interval of 200 µm on the average in the surface of the support portion positioned on the extending-direction side of the arm portions. The sectional shape of the groove in the depth direction was substantially the U-shape.

Comparative Example 1

The piezoelectric/electrostrictive device was manufactured in the same manner as in Example 1 except that a step of etching the inner surface of the support portion was not carried out.

Evaluation

For the piezoelectric/electrostrictive device obtained in Comparative Example 1, the vibration having an amplitude of 1.0 µm or more was already caused at a wind velocity of 10 m/s (corresponding to the wind velocity generated at the time of the rotation of the hard disk at 1000 rpm) in the vibration isolation property test.

On the other hand, for the piezoelectric/electrostrictive device obtained in Example 1, the generation of the vibration having an amplitude of 0.01 µm or more was not recognized up to a wind velocity of 60 m/s (corresponding to the wind velocity generated at the time of the rotation of the hard disk at 12000 rpm) in the vibration isolation property test, and the vibration isolation properties were largely enhanced.

The generation of the vibration having an amplitude of 0.01 µm or more was not recognized up to a wind velocity of 70 m/s in the piezoelectric/electrostrictive device of Example 2 in which the plurality of grooves was formed in the surface positioned on the extending-direction side of the arm portions and the surface positioned on the opposite side.

On the other hand, in Example 3 in which the length of the groove was set to 0.15 mm and the plurality of grooves was formed in lengths that did not reach the edge of the thickness direction in the support portion, the generation of the vibration having an amplitude of 1.0 µm or more was recognized at a wind velocity of 50 m/s. A drop of wind velocity at which the vibration having an amplitude of 1.0 µm or more was observed as compared with Example 1 in which the length of the groove was set to 0.25 mm and the grooves were formed in the lengths reaching the edge of the thickness direction in the support portion.

As described above, according to the present invention, there can be provided the piezoelectric/electrostrictive device which is large in vibration isolation properties against the airflow necessarily generated in the attached device and which meets demands for high-rate access or densification of data and which is capable of inhibiting off-track from being caused.

What is claimed is:

1. A piezoelectric/electrostrictive device comprising:
    a substrate including a support portion constituted of a thick member and two arm portions constituted of thin-plate members extended from the support portion, the support portion having first regions adjacent each of the arm portions, and a second region spaced inwardly from the first regions; and
    a driving member including at least one pair of electrodes and one piezoelectric/electrostrictive layer which are disposed on at least one arm portion,
    wherein a plurality of grooves is formed in at least a surface positioned on an extending-direction side of said at least one arm portion in the second region of the support portion.

2. The piezoelectric/electrostrictive device according to claim 1, further comprising a plurality of grooves formed in a surface disposed opposite to the surface positioned on said extending-direction side of the arm portion in the support portion.

3. The piezoelectric/electrostrictive device according to claim 1, wherein the plurality of grooves formed in the surface positioned on said extending-direction side of the arm portion in the support portion extends in a direction through which an airflow that has collided with a support portion surface is capable of blowing.

4. The piezoelectric/electrostrictive device according to claim 2, wherein the plurality of grooves formed in the surface positioned on said extending-direction side of the arm portion in the support portion extends in a direction through which an airflow that has collided with a support portion surface is capable of blowing.

5. The piezoelectric/electrostrictive device according to claim 3, wherein tips of the plurality of grooves formed in the surface positioned on said extending-direction side of the arm portion in the support portion is formed to extend to an edge of the direction through which the airflow is capable of blowing in the support portion.

6. The piezoelectric/electrostrictive device according to claim 1, wherein the plurality of grooves formed in the surface positioned on said extending-direction side of the arm portion in the support portion is formed to extend in a direction perpendicular to the direction through which the airflow that has collided with the support portion surface is capable of blowing.

7. The piezoelectric/electrostrictive device according to claim 1, wherein the plurality of grooves is arranged at an interval of 10 to 500 µm on the average.

8. The piezoelectric/electrostrictive device according to claim 2, wherein the plurality of grooves formed in the surface disposed opposite to the surface positioned on said extending-direction side of the arm portion in the support portion is arranged at an interval of 10 to 500 µm on the average.

9. The piezoelectric/electrostrictive device according to claim 1, wherein a depth of the plurality of grooves is 5 to 100 μm.

10. The piezoelectric/electrostrictive device according to claim 2, wherein a depth of the plurality of grooves formed in the surface disposed opposite to the surface positioned on said extending-direction side of the arm portion in the support portion is 5 to 100 μm.

11. The piezoelectric/electrostrictive device according to claim 9, wherein the depth of the plurality of grooves is formed with a fluctuation at a standard deviation of 3 μm or more.

12. The piezoelectric/electrostrictive device according to claim 10, wherein the depth of the plurality of grooves formed in the surface disposed opposite to the surface positioned on said extending-direction side of the arm portion in the support portion is formed with a fluctuation at a standard deviation of 3 μm or more.

13. The piezoelectric/electrostrictive device according to claim 1, wherein a length of a portion of the arm portion projecting from the support portion is 2.5 mm or less, and a thickness in a direction perpendicular to said extending direction of the arm portion in the support portion is 0.5 mm or less.

14. The piezoelectric/electrostrictive device according to claim 2, wherein a length of a portion of the arm portion projecting from the support portion is 2.5 mm or less, and a thickness in a direction perpendicular to said extending direction of the arm portion in the support portion is 0.5 mm or less.

15. A piezoelectric/electrostrictive device comprising:
a substrate including a support portion constituted of a thick member and two arm portions constituted of thin-plate members extended from the support portion; and
a driving member including at least one pair of electrodes and one piezoelectric/electrostrictive layer which are disposed on at least one arm portion,
wherein a plurality of grooves is fanned in at least a surface positioned on an extending-direction side of said at least one arm portion in the support portion and in a surface disposed opposite to the surface positioned on said extending-direction side of the arm portion in the support portion.

16. The piezoelectric/electrostrictive device according to claim 15, wherein the plurality of grooves formed in the surface positioned on said extending-direction side of the arm portion in the support pardon extends in a direction through which an airflow that has collided with a support portion surface is capable of blowing.

17. The piezoelectric/electrostrictive device according to claim 15, wherein the plurality of grooves formed in the surface disposed opposite to the surface positioned on said extending-direction side of the arm portion in the support portion is arranged at an interval of 10 to 500 μm on the average.

18. The piezoelectric/electrostrictive device according to claim 15, wherein a depth of the plurality of grooves formed in the surface disposed opposite to the surface positioned on said extending-direction side of the arm portion in the support portion is 5 to 100 μm.

19. The piezoelectric/electrostrictive device according to claim 18, wherein the depth of the plurality of grooves formed in the surface disposed opposite to the surface positioned on said extending-direction side of the arm portion in the support portion is formed with a fluctuation at a standard deviation of 3 μm or more.

20. The piezoelectric/electrostrictive device according to claim 15, wherein a length of a portion of the arm portion projecting from the support portion is 2.5 mm or less, and a thickness in a direction perpendicular to said extending direction of the arm portion in the support portion is 0.5 mm or less.

21. A piezoelectric/electrostrictive device comprising:
a substrate including a support portion constituted of a thick member and two arm portions constituted of thin-plate members extended from the support portion; and
a driving member including at least one pair of electrodes and one piezoelectric/electrostrictive layer which are disposed on at least one arm portion,
wherein a plurality of grooves is formed at an interval of 10 to 500 μm on the average in at least a surface positioned on an extending-direction side of said at least one arm portion in the support portion.

22. A piezoelectric/electrostrictive device comprising:
a substrate including a support portion constituted of a thick member and two arm portions constituted of thin-plate members extended from the support portion; and
a driving member including at least one pair of electrodes and one piezoelectric/electrostrictive layer which are disposed on at least one arm portion,
wherein a plurality of grooves having a depth of 5 to 100 μm and a fluctuation at a standard deviation of 3 μm or more is formed in at least a surface positioned on an extending-direction side of said at least one arm portion in the support portion.

* * * * *